(12) United States Patent
Schulze et al.

(10) Patent No.: US 10,607,839 B2
(45) Date of Patent: Mar. 31, 2020

(54) METHOD OF REDUCING AN IMPURITY CONCENTRATION IN A SEMICONDUCTOR BODY

(71) Applicant: Infineon Technologies AG, Neubiberg (DE)

(72) Inventors: Hans-Joachim Schulze, Taufkirchen (DE); Peter Irsigler, Obernberg/Inn (AT); Thomas Wuebben, Unterschuett (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/635,358

(22) Filed: Jun. 28, 2017

(65) Prior Publication Data
US 2018/0005831 A1    Jan. 4, 2018

(30) Foreign Application Priority Data
Jul. 1, 2016  (DE) .......................... 10 2016 112 139

(51) Int. Cl.
*H01L 21/265*  (2006.01)
*H01L 21/324*  (2006.01)
(Continued)

(52) U.S. Cl.
CPC ...... *H01L 21/26526* (2013.01); *H01L 21/263* (2013.01); *H01L 21/26506* (2013.01); *H01L 21/324* (2013.01); *H01L 29/0638* (2013.01); *H01L 29/32* (2013.01); *H01L 29/36* (2013.01); *H01L 29/66136* (2013.01); *H01L 29/66734* (2013.01); *H01L 29/7813* (2013.01); *H01L 29/868* (2013.01); *H01L 21/26533* (2013.01)

(58) Field of Classification Search
CPC ......... H01L 21/26506; H01L 21/26533; H01L 29/0607; H01L 21/26526; H01L 29/32; H01L 29/36; H01L 29/66136; H01L 29/66734; H01L 29/7813; H01L 29/868; H01L 21/263; H01L 21/324
USPC .......................................................... 438/520
See application file for complete search history.

(56) References Cited

U.S. PATENT DOCUMENTS

| | | | | |
|---|---|---|---|---|
| 4,047,976 A | * | 9/1977 | Bledsoe | ............ H01L 21/26506 |
| | | | | 438/340 |
| 4,391,651 A | * | 7/1983 | Yoder | ................. H01L 21/2654 |
| | | | | 438/520 |

(Continued)

FOREIGN PATENT DOCUMENTS

DE       102012102341 A1    10/2012

OTHER PUBLICATIONS

Newman, R.C.; Defects In Silicon; Rep. Prog. Phys.; vol. 45; pp. 1163-1210. (Year: 1982).*

*Primary Examiner* — Mary A Wilczewski
(74) *Attorney, Agent, or Firm* — Murphy, Bilak & Homiller, PLLC

(57) ABSTRACT

A method includes kicking out impurity atoms from substitutional sites of a crystal lattice of a semiconductor body by implanting particles via a first surface into the semiconductor body, reducing a thickness of the semiconductor body by removing semiconductor material of the semiconductor body, and annealing the semiconductor body in a first annealing process at a temperature of between 300° C. and 450° C. to diffuse impurity atoms out of the semiconductor body.

22 Claims, 3 Drawing Sheets

(51) Int. Cl.
*H01L 29/06* (2006.01)
*H01L 29/36* (2006.01)
*H01L 29/78* (2006.01)
*H01L 29/868* (2006.01)
*H01L 29/66* (2006.01)
*H01L 29/32* (2006.01)
*H01L 21/263* (2006.01)

(56) References Cited

U.S. PATENT DOCUMENTS

| | | | | |
|---|---|---|---|---|
| 4,393,577 A | * | 7/1983 | Imai | H01L 21/26506 438/295 |
| 4,539,743 A | * | 9/1985 | Anthony | H01L 21/2654 438/23 |
| 6,323,108 B1 | * | 11/2001 | Kub | H01L 21/76254 257/E21.568 |
| 6,368,938 B1 | * | 4/2002 | Usenko | H01L 21/3226 257/E21.568 |
| 6,992,025 B2 | * | 1/2006 | Maa | H01L 21/76254 257/E21.568 |
| 7,982,289 B2 | * | 7/2011 | Schulze | H01L 21/263 257/607 |
| 8,361,893 B2 | * | 1/2013 | Schmidt | H01L 21/223 438/518 |
| 9,029,243 B2 | * | 5/2015 | Schulze | H01L 21/223 438/471 |
| 9,159,783 B2 | * | 10/2015 | Schmidt | H01L 21/223 |
| 9,263,529 B2 | * | 2/2016 | Schmidt | H01L 21/3221 |
| 9,443,774 B2 | * | 9/2016 | Mizushima | H01L 29/32 |
| 9,530,672 B2 | * | 12/2016 | Kobayashi | H01L 29/7397 |
| 9,589,802 B1 | * | 3/2017 | Hatem | H01L 21/324 |
| 9,947,761 B2 | * | 4/2018 | Kobayashi | H01L 29/7397 |
| 9,953,835 B2 | * | 4/2018 | Hatem | H01L 21/324 |
| 9,972,704 B2 | * | 5/2018 | Jelinek | H01L 21/263 |
| 10,128,328 B2 | * | 11/2018 | Jelinek | H01L 29/7802 |
| 10,134,853 B2 | * | 11/2018 | Schulze | H01L 21/3221 |
| 2002/0025604 A1 | * | 2/2002 | Tiwari | H01L 21/76254 438/118 |
| 2005/0025959 A1 | * | 2/2005 | Bellman | C23C 14/48 428/336 |
| 2005/0054182 A1 | * | 3/2005 | Wang | H01L 21/265 438/528 |
| 2005/0153524 A1 | * | 7/2005 | Maa | H01L 21/76254 438/458 |
| 2006/0141748 A1 | * | 6/2006 | Daval | H01L 21/26506 438/455 |
| 2006/0286753 A1 | * | 12/2006 | Barthelmess | H01L 21/263 438/282 |
| 2007/0108512 A1 | * | 5/2007 | Sedlmaier | H01L 29/0634 257/328 |
| 2008/0315364 A1 | * | 12/2008 | Nemoto | H01L 21/2255 257/617 |
| 2009/0246936 A1 | * | 10/2009 | Yamazaki | H01L 21/76254 438/458 |
| 2009/0246937 A1 | * | 10/2009 | Yamazaki | H01L 21/02057 438/458 |
| 2009/0261449 A1 | * | 10/2009 | Yamazaki | H01L 21/76254 257/507 |
| 2010/0173171 A1 | * | 7/2010 | Yashiki | C22C 14/00 428/586 |
| 2012/0267681 A1 | * | 10/2012 | Nemoto | H01L 21/263 257/139 |
| 2013/0119582 A1 | * | 5/2013 | Schibsbye | B29C 31/006 264/310 |
| 2014/0097488 A1 | * | 4/2014 | Schulze | H01L 21/223 257/330 |
| 2014/0246750 A1 | * | 9/2014 | Takishita | H01L 21/263 257/493 |
| 2014/0246755 A1 | * | 9/2014 | Yoshimura | H01L 29/32 257/617 |
| 2014/0357026 A1 | * | 12/2014 | Kobayashi | H01L 29/7397 438/135 |
| 2015/0050798 A1 | * | 2/2015 | Kobayashi | H01L 29/7397 438/475 |
| 2015/0228736 A1 | * | 8/2015 | Sakakibara | H01L 29/4236 257/330 |
| 2015/0270130 A1 | | 9/2015 | Schulze et al. | |
| 2016/0141399 A1 | * | 5/2016 | Jelinek | H01L 21/263 257/139 |
| 2017/0170028 A1 | * | 6/2017 | Schustereder | H01L 21/26506 |
| 2017/0358484 A1 | * | 12/2017 | Liu | H01L 21/76254 |
| 2018/0005831 A1 | * | 1/2018 | Schulze | H01L 29/32 |
| 2018/0247860 A1 | * | 8/2018 | Ishizuka | H01L 21/02 |
| 2018/0294182 A1 | * | 10/2018 | Wang | H01L 21/76254 |
| 2018/0294183 A1 | * | 10/2018 | Wang | H01L 21/76251 |
| 2018/0330983 A1 | * | 11/2018 | Wang | H01L 21/76254 |
| 2018/0350688 A1 | * | 12/2018 | Or-Bach | G11C 5/025 |
| 2018/0350689 A1 | * | 12/2018 | Or-Bach | H03K 19/17796 |
| 2018/0350785 A1 | * | 12/2018 | Fong | H01L 21/8221 |
| 2019/0006240 A1 | * | 1/2019 | Or-Bach | G11C 5/025 |
| 2019/0006467 A1 | * | 1/2019 | Xue | H01L 29/1095 |

\* cited by examiner

METHOD OF REDUCING AN IMPURITY CONCENTRATION IN A SEMICONDUCTOR BODY

TECHNICAL FIELD

This disclosure in general relates to processing a semiconductor body in order to reduce an impurity concentration in the semiconductor body.

BACKGROUND

A semiconductor device can be formed from a monocrystalline semiconductor body using different processing techniques. Those techniques may include growing epitaxial layers, introducing dopant atoms, or forming electrodes, to name only a few. Usually, the semiconductor body is part of a wafer that has been cut from an ingot. The wafer may include a plurality of semiconductor bodies that can be cut from the wafer after the processing.

The ingot and, therefore, the wafer may include undesired impurities incorporated into the ingot during the manufacturing process. A silicon ingot formed by using the Magnetic Czochralski (MCZ) method, for example, may include nitrogen and carbon and oxygen as impurities. A silicon ingot formed using the Float Zone (FZ) method, for example, may include nitrogen. The impurity atoms are at substitutional sites in the crystal lattice of the ingot and the wafer, respectively.

Those impurities may have several negative effects. (a) Nitrogen may act as dopant, recombination center, or generation center and may, therefore, affect the electric properties of semiconductor devices formed from the wafer. (b) Nitrogen as well as carbon can react with oxygen, which may also be available in an MCZ wafer, to form complexes that act like dopants. Those dopant-like complexes may also affect the electric properties of semiconductor devices formed from the wafer. (c) Carbon may affect the diffusion of dopant atoms introduced intentionally in the manufacturing process of the semiconductor device, resulting in varying doping concentration. (d) Carbon and silicon may form undesired silicon carbide (SiC) precipitates.

SUMMARY

There is therefore a need to reduce the concentration of undesired impurities in a semiconductor body.

One example relates to a method. The method includes kicking out impurity atoms from substitutional sites of a crystal lattice of a semiconductor body by implanting particles via a first surface into the semiconductor body, reducing a thickness of the semiconductor body by removing semiconductor material of the semiconductor body, and annealing the semiconductor body in a first annealing process at a temperature of between 300° C. and 450° C. to diffuse impurity atoms out of the semiconductor body.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings, the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1A:
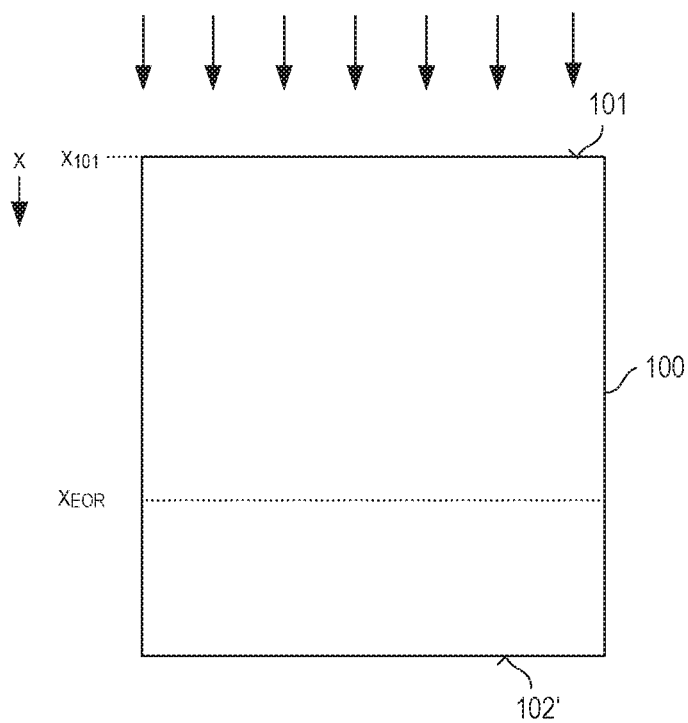
FIGS. 1A-1E illustrate one example of a method for locally reducing an impurity concentration in a semiconductor body.

FIGS. 1A-1E illustrate one example of a method for at least locally reducing an impurity concentration in a semiconductor body 100. FIG. 1A shows a vertical cross-sectional view of the semiconductor body 100 during a first processing. The semiconductor body 100 includes a first surface 101 and a second surface 102' spaced apart from the first surface 101 in a vertical direction x. The "vertical direction x" is a direction of the semiconductor body 100 perpendicular to the first surface 101 and the second surface 102', respectively.

The semiconductor body 100 includes a monocrystalline semiconductor material. According to one example, the semiconductor material is silicon. According to one example, the silicon is silicon produced in accordance with one of the Magnetic Czochralski (MCZ), the Czochralski (CZ) and the Float Zone (FZ) method. That is, a monocrystalline silicon ingot is produced in accordance with one of these methods, wafers are cut from this ingot and the semiconductor body 100 shown in FIG. 1A is cut from one of these wafers. It should be noted that FIG. 1A schematically illustrates one section of the semiconductor body 100. The process sequences explained in the following can be applied to a semiconductor wafer that includes one or more semiconductor bodies. According to one example, a plurality of substantially identical semiconductor bodies are cut from one wafer after the process sequences explained in the following.

The semiconductor body 100 may include undesired impurities that have been incorporated into the ingot during the manufacturing process. These impurities may include nitrogen atoms, carbon atoms or oxygen atoms. The impurities are at substitutional or interstitial sites in the crystal lattice of the monocrystalline semiconductor body 100. These impurities can be homogenously distributed in the semiconductor body 100.

These impurities can have negative effects on the operation of a semiconductor device formed from the impurity containing semiconductor body. It is therefore desirable to at least locally reduce the concentration of those impurities in the semiconductor body 100.

Referring to FIG. 1A, the method to at least locally reduce the impurity concentration in the semiconductor body 100 includes kicking out impurity atoms such as, in particular, carbon or nitrogen atoms from substitutional sites of the crystal lattice of the semiconductor body 100 by implanting particles via the first surface 100 into the semiconductor body 100. According to one example, the particles include at least one of protons (hydrogen (H) ions) and helium (He) ions.

Implanting the particles via the first surface 101 includes implanting the particles into an end-of-range region of the semiconductor body 100. The "end-of-range region" is a region of the semiconductor body 100 that includes an end-of-range of the implantation process. The "end-of-range" of the implantation process is a location in the semiconductor body 100 spaced apart from the first surface 101 where the majority of the implanted particles come to rest in the semiconductor body 100.

The particles implanted into the semiconductor body 100 kick out impurity atoms from substitutional sites of the crystal lattice of the semiconductor body 100 so that the impurity atoms come to rest at interstitial sites of the crystal lattice of the semiconductor body 100. Referring to the above, the impurity atoms may, in particular, include carbon or nitrogen atoms. Besides kicking out impurity atoms from substitutional sites implanting the particles may also result in a dissociation of electrically inactive nitrogen pairs. Implanting the particles may also result in kicking out semiconductor atoms which, however, is not critical.

Figure 1B:
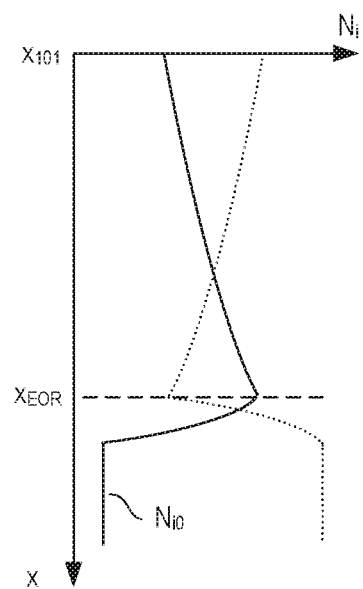

FIG. 1B schematically illustrates a concentration Ni of interstitial impurity atoms in the semiconductor body 100 after implanting the particles via the first surface 101. FIG. 1B shows the impurity concentration in the vertical direction of the semiconductor body 100. In FIG. 1B, $x_{101}$ represents the vertical position of the first surface 101, and $x_{EOR}$ represents the vertical position of the end-of-range in the semiconductor body 100. As can be seen from FIG. 1B, the concentration of interstitial impurity atoms increases, beginning at the first surface 101, towards the end-of-range as the capability of the implanted particles to transfer energy to the impurity atoms so as to kick out the impurity atoms increases towards the end-of-range so that such energy transfer, in particular, occurs in the end-of-range. Beyond the end-of-range, as seen from the first surface 101, the concentration of interstitial impurity atoms decreases rapidly. An interstitial impurity concentration $n_{i0}$ between the end-of-range and the second surface 102' essentially corresponds to the interstitial impurity concentration that prevails in the semiconductor body 100 before the implantation process.

An increase of the interstitial impurity concentration in those regions of the semiconductor body 100 into which the particles have been implanted coincides with a decrease of the substitutional impurity concentration. That is, the interstitial impurity atoms result from substitutional impurity atoms, so that to the same extent in which the interstitial impurity concentration increases the substitutional impurity concentration decreases. The dotted line in FIG. 1B illustrates the substitutional impurity concentration in the semiconductor body 100.

Figure 1C:
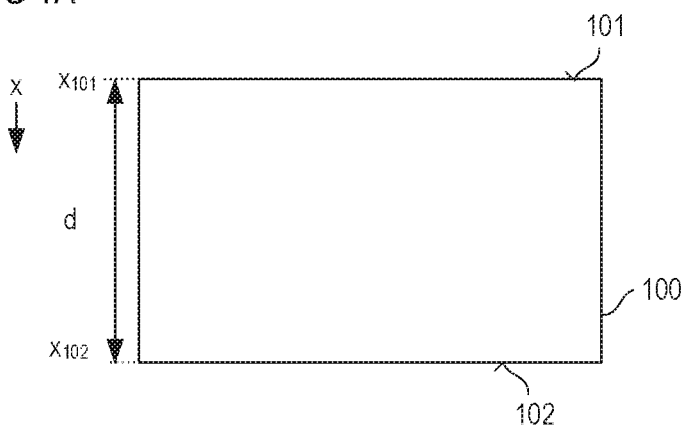

Referring to FIG. 1C, the method further includes reducing a thickness of the semiconductor body 100 by removing semiconductor material of the semiconductor body 100. According to one example, as shown in FIG. 1C, removing the semiconductor material includes removing the semiconductor material at the second surface 102', which is the surface opposite the first surface 101 into which the particles were implanted. In FIG. 1A, reference character 102' denotes the second surface before the removal process and, in FIG. 1C, reference character 102 denotes the second surface after the removal process. The removal process may include any process suitable to remove semiconductor material at the second surface 102'. Examples of such a process include an etching process, a mechanical polishing process or a chemical-mechanical polishing (CMP) process.

According to one example, removing the semiconductor material includes removing the end-of-range region of the semiconductor body 100. That is, a thickness d of the semiconductor body 100 after the removal process is smaller than a distance between the first surface 101 and the end-of-range $x_{EOR}$. That is, $$d < |x_{EOR} - x_{101}| \qquad (1),$$

where d is the thickness of the semiconductor body 100 after the removal process, $x_{101}$ is the vertical position of the first surface 101, and $x_{EOR}$ is the vertical position of the end-of-range of the implantation process explained with reference to FIG. 1A.

Figure 1D:
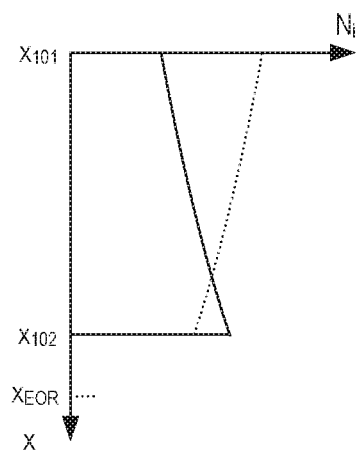

FIG. 1D shows the interstitial impurity concentration in the semiconductor body 100 with the reduced thickness. Reducing the thickness of the semiconductor body 100 does not substantially change the interstitial impurity concentration in the semiconductor body 100. By removing semiconductor material between the second surface 102' and the end-of-range, or even beyond the end-of-range, those regions of the semiconductor body 100 that have a high substitutional impurity concentration (because substitutional impurity atoms have not been kicked out in these regions) are removed. The dotted line in FIG. 1D illustrate the substitutional impurity concentration in the semiconductor body 100.

The method further includes annealing the semiconductor body in a first annealing process at a temperature of between 300° C. and 450° C., in particular between 320° C. and 420° C., in order to diffuse impurity atoms out of the semiconductor body 100. In this first annealing process, mainly interstitial impurity atoms diffuse out of the semiconductor body, because interstitial impurity atoms have a much higher diffusion constant than substitutional impurity atoms.

The impurity atoms diffuse out of the semiconductor body 100 via the second surface 102. Thus, the first annealing process results in a reduction of the interstitial impurity concentration especially in those regions of the semiconductor body 100 close to the second surface 102. To some extent, impurity atoms may also diffuse out of the semiconductor body 100 at the first surface 101. However, as the concentration of interstitial impurity atoms is higher in the region of the second surface 102 than in the region of the first surface 101 the outdiffusion via the first surface is significantly lower. Furthermore, a coating (not shown) may be deposited on the first surface prior to the outdiffusion process. This coating may prevent or reduce an outdiffusion via the first surface 101. According to one example, there is no such coating on the second surface 102 during the outdiffusion process. As, referring to FIG. 1D, the interstitial impurity concentration, as seen from the first surface 101 increases towards the second surface 102, there is a particularly high interstitial impurity concentration in the region of the second surface 102. Thus, the first annealing process results in a particularly strong reduction of interstitial impurity atoms in the region of the second surface 102.

Figure 1E:
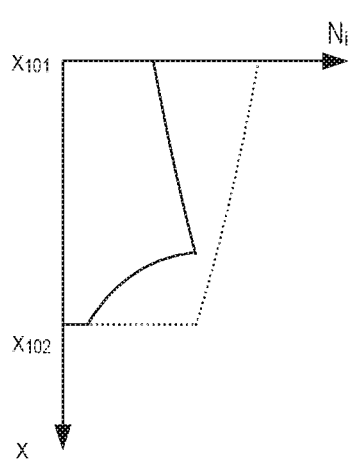

This is illustrated in FIG. 1E, which shows the interstitial impurity concentration (in solid lines) and the substitutional impurity concentration (in dotted lines) in the semiconductor body 100 after the first annealing process. Referring to FIG. 1E, the first annealing process results in a particularly low overall impurity concentration in the semiconductor body 100 in the region of the second surface 102. The "overall impurity concentration" is the interstitial impurity concentration plus the substitutional impurity concentration. The substitutional impurity concentration is already reduced in the implantation process explained with reference to FIGS. 1A and 1B, and the interstitial impurity concentration is reduced by the first annealing process explained with reference to FIG. 1E. A potential reduction of the impurity concentration in the region of the first surface 101 is not considered in FIG. 1E.

According to one example, a duration of the first annealing process is between 30 minutes and 80 hours (h), in particular between 1 h and 10 h. According to one example, the temperature in the first annealing process is between 350° C. and 400° C. and the duration is between 30 minutes and 10 hours. According to another example, the temperature is between 300° C. and 350° C. and the duration is between 2 hours and 80 hours. Basically, the overall amount of interstitial impurity atoms that diffuse out of the semiconductor body 100 increase as the duration of the first annealing process increases and as the temperature of the first annealing process increases.

Figure 2:
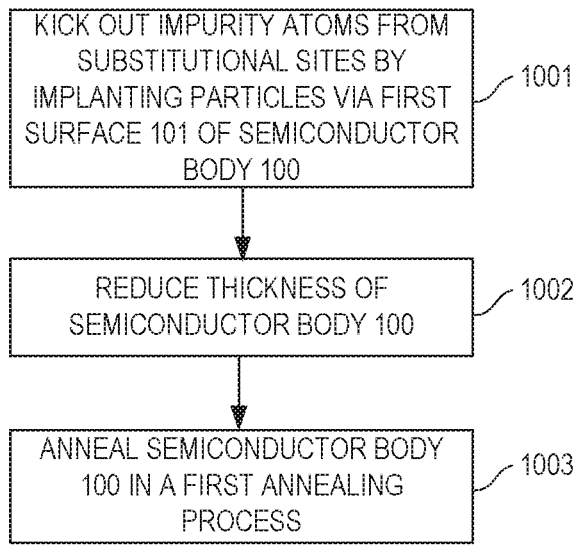
FIG. 2 shows a flow-chart of one example of a method for locally reducing an impurity concentration in a semiconductor body.

A flow chart of the process sequence explained with reference to FIGS. 1A to 1E is illustrated in FIG. 2. Referring to this flow chart, the method includes kicking out impurity atoms from substitutional sites of the crystal lattice of the semiconductor body by implanting particles via the first surface into the semiconductor body (Block 1001); reducing the thickness of the semiconductor body 100 by removing semiconductor material of the semiconductor body 100 (Block 1002); and annealing the semiconductor body in the first annealing process (Block 1003).

According to one example, the semiconductor body 100, before the implantation process explained with reference to FIG. 1A, has a basic doping of one doping type (conductivity type). According to one example, the doping type is an n-type, and the doping concentration is between 1E13 cm$^{-3}$ and 1E16 cm$^{-3}$.

Figure 3:
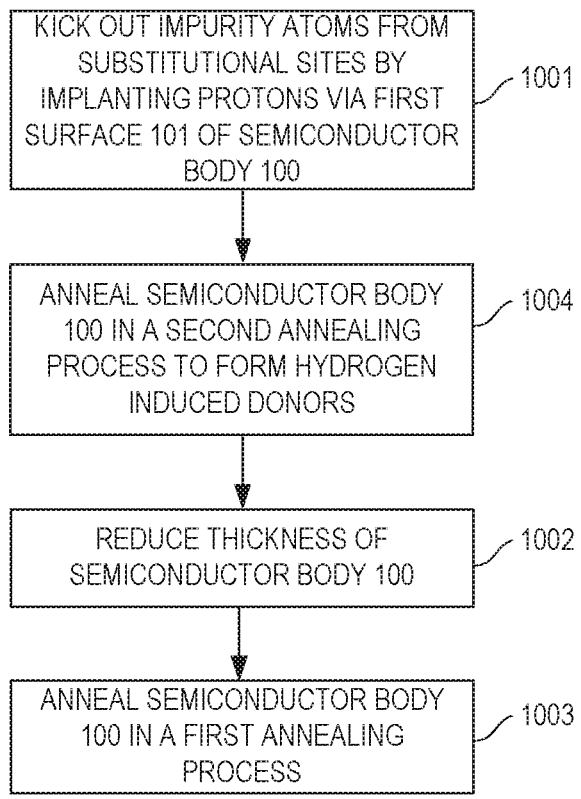
FIG. 3 shows a flow-chart of a modified method.

According to one example, the particles implanted into the semiconductor body 100 in the implantation process include protons, and the method further includes a second annealing process after implanting the protons, before reducing the thickness of the semiconductor body 100, and before the first annealing process. A flow chart of this process is shown in FIG. 3. The flow chart shown in FIG. 3 is based on the flow chart shown in FIG. 2 and additionally includes the second annealing process (Block 1004). According to one example, a temperature in the second annealing process is between 460° C. and 550° C. or between 470 and 510° C. and a duration of the second annealing process is between 30 minutes and 20 hours. According to one example, the duration of the second annealing process is between 2 hours and 10 hours. According to one example, the temperature in the second annealing process is between 460° C. and 520° C. In the second annealing process, the protons implanted in the second implantation process diffuse from the end-of-range towards the first surface 101 and, induced by defects produced in the crystal lattice by the implantation process, form complexes that act like donors. Those complexes are commonly referred to as hydrogen induced donors. In this process, the protons not only serve to kick out substitutional impurity atoms but, in the region between the first surface 101 and the end-of-range, increase the n-type doping concentration of the semiconductor body 100. According to one example, the semiconductor body 100 is intrinsic before the implantation process. In this case, a basic doping of the semiconductor body 100 between the first surface 101 and the end-of-range is essentially formed by the hydrogen induced donors. According to another example, the semiconductor body 100 has an n-type doping concentration lower than 1E14 cm$^{-3}$ before the implantation process. In this case, the hydrogen induced donors increase the n-type basic doping of the semiconductor body 100.

A region of the semiconductor body 100 that adjoins the second surface 102 and in which the impurity concentration has been reduced by diffusing interstitial impurity atoms out of the semiconductor body 100 is referred to as reduced impurity concentration or low impurity region in the following. According to one example, the method further includes forming a doped region of one conductivity type in the reduced impurity region. According to one example, the doped region is an n-type region that includes hydrogen induced donors. Especially in this case a low interstitial carbon concentration may be desirable because interstitial carbon atoms can form complexes with interstitial oxygen atoms and hydrogen atoms. Those complexes, which are often referred to as $C_iO_iH_n$-complexes, may act as donors and can therefore change the field stop doping profile in an uncontrolled and undesired way.

Figure 4A:
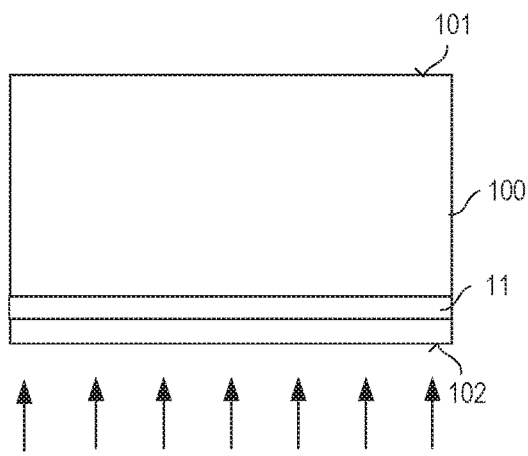
FIGS. 4A-4B illustrate one example of a method for producing a field stop region in a semiconductor body with a locally reduced impurity concentration of the type shown in FIG. 1D.
Figure 4B:
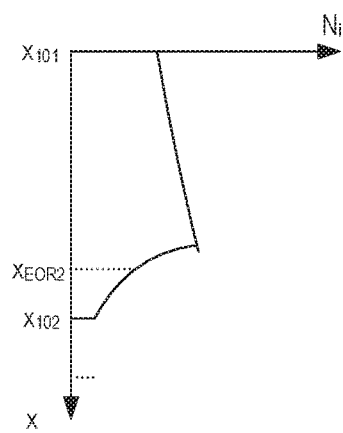

Referring to FIG. 4A, forming the doped region may include implanting protons via the second surface 102 into the semiconductor body 100, and annealing the semiconductor body 100 in a further annealing process. According to one example, a temperature in this annealing process is between 360° C. and 420° C., in particular between 380° C. and 420° C. A duration may be between 30 minutes and 10 hours, in particular between 1 h and 5 h. According to one example, an implantation energy in the implantation process shown in FIG. 4A is selected such, that the end-of-range of this implantation process is within the reduced impurity region. This is illustrated in FIG. 4B that illustrates the interstitial doping concentration and the position $x_{EOR2}$ of the end-of-range of this second implantation process. According to one example, a duration of the annealing process that forms the doped region 11 based on the protons implanted in the second implantation process is such that the protons do not significantly diffuse towards the second surface 102, so as to obtain a doped region 11 with a vertical dimension of between 1 μm and 40 μm or between 3 μm and 25 μm, for example.

In the example explained above, the doped region 11 is formed in the reduced impurity concentration region, that is, after the (interstitial) impurity concentration has been reduced by diffusing out impurity atoms. According to another example, the doped region 11 is formed after reducing the thickness of the semiconductor body 100, but before diffusing out the impurity atoms from the semiconductor body 100. According to one example, a temperature of the first annealing process is between 300° C. and 350° C. in this case, and a duration of the first annealing process is between 2 hours and 80 hours. In this example, the impurity concentration is reduced after forming the doped region 11, whereas the doped region 11 is formed in a region of the semiconductor body 100 where a reduced impurity concentration region is formed by diffusing out impurity atoms.

Figure 5:
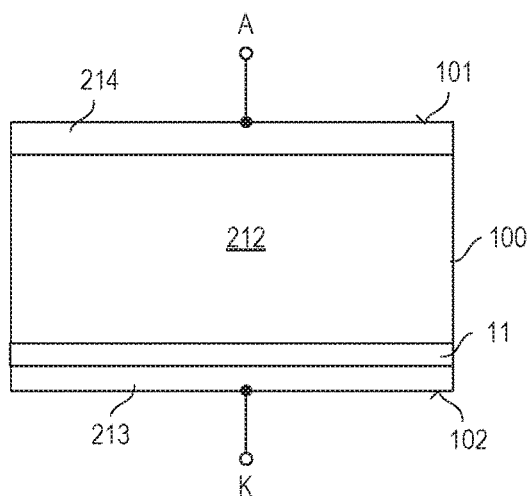
FIG. 5 illustrates one example of a semiconductor device that is based on a semiconductor body of the type shown in FIG. 2A.
Figure 6:
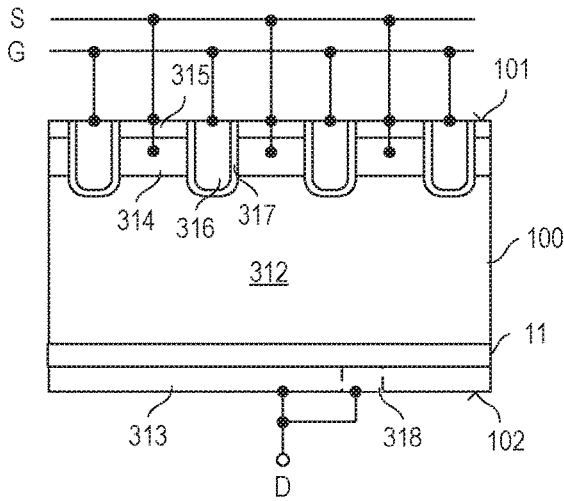
FIG. 6 illustrates another example of a semiconductor device that is based on a semiconductor body of the type shown in FIG. 2A.

Based on the semiconductor body 100 shown in FIG. 4A, that includes a doped region 11 in a low impurity region a plurality of different types of semiconductor devices can be produced. Two different types of those semiconductor devices are shown in FIGS. 5 and 6. Each of these Figures shows a vertical cross-sectional view of one section of a semiconductor device.

The semiconductor device shown in FIG. 5 is a diode, in particular a p-i-n diode. In this diode, the doped region 11 explained with reference to FIG. 4A is a field-stop region. Besides the field-stop-region 11, the diode includes a base region 212 adjoining the field-stop-region 11. The base region 212 is an n-type region. A doping concentration of the base region 212 may correspond to the doping concentration of the basic doping of the semiconductor body 100. Referring to the above, the basic doping of the semiconductor body 100 can be the doping concentration the semiconductor body 100 has before the implantation process explained with reference to FIG. 1A and/or the doping obtained by implanting protons via the first surface 101 and the second annealing process. Furthermore, the diode includes a p-type emitter 214 adjoining the base region 212 and an n-type emitter 213 adjoining the field-stop region 11. An anode terminal A (which is only schematically illustrated in FIG. 5) is connected to the p-type emitter, and a cathode terminal K (which is only schematically illustrated in FIG. 5) is connected to the n-type emitter. Forming the n-type emitter 213 and the p-type emitter 214 may include implantation processes after forming the field-stop region 11. According to one example, a doping concentration of each of the n-type emitter 213 and the p-type emitter 214 is selected from between $1E16$ cm$^{-3}$ and $1E19$ cm$^{-3}$, for example, whereas a doping concentration of the n-type emitter 213 may be higher than a doping concentration of the p-type emitter 214. Towards the second surface 102 the doping concentration of the n-type emitter may be higher than $1E19$ cm$^{-3}$.

FIG. 6 shows a semiconductor device of another type. The semiconductor device shown in FIG. 6 is implemented as a MOS transistor in which the doped region 11 explained with reference to FIG. 4A is a field-stop region. The MOS transistor, besides the field-stop region 11, includes a drift region 212 adjoining the field-stop region 11. Like the field-stop region 11, the drift region 212 is an n-type region. A doping concentration of the drift region 312 may correspond to the doping concentration of the basic doping of the semiconductor body 100. A body region 314 adjoins the drift region 312 and separates a source region 315 from the drift region 312. The body region 314 is a p-type region, and the source region 315 is an n-type region. A gate electrode 316 is adjacent the body region 314 and dielectrically insulated from the body region 314 by a gate dielectric 317. The MOS transistor may include a plurality of transistor cells, with each of these transistor cells including a source region 315, a body region 314, a gate electrode 316, and a gate dielectric 317. The individual transistor cells may share the drift region 312 and the field-stop region 11. The gate electrodes 316 of the individual transistor cells are connected to a common gate node G, and the source regions 315 and the body regions 314 of the individual transistor cells are connected to a common source node S.

Furthermore, the MOS transistor includes a drain region 313 that adjoins the field-stop-region 11. The MOS transistor can be a MOSFET. In this case, the drain region 313 is an n-type region. According to another example, the MOS transistor is an IGBT. In this case, the drain region 313 (which may also be referred to as collector region) is a p-type region. The drain region 313 is connected to a drain node D (which is only schematically illustrated in FIG. 6).

An IGBT can be implemented as a reverse conducting (RC) IGBT. In this case, there is at least one n-type region 318 connected between the drain node D and the field-stop-region 11. Such n-type region, which is often referred to as emitter short region, is illustrated in dashed lines in FIG. 6. These device regions may be formed after forming the field-stop region 11. The MOS transistor shown in FIG. 6 is drawn as a trench transistor. In this case, the gate electrode 316 is arranged in a trench of the semiconductor body. This, however, is only an example. According to another example (not shown), the MOS transistor is implemented with a planar gate electrode that is arranged above the first surface 101 of the semiconductor body 100.

In the MOS transistor shown in FIG. 6, according to one example, a doping concentration of the body region is selected from between $1E16$ cm$^{-3}$ and $1E17$ cm$^{-3}$, and a doping concentration of the source region 315 is selected from between $1E16$ cm$^{-3}$ and $1E19$ cm$^{-3}$. In a MOSFET, a doping concentration of the drain region 313 is selected from between $1E16$ cm$^{-3}$ and $1E19$ cm$^{-3}$, for example, and in an IGBT a doping concentration of the drain region 313 is selected from between $1E16$ cm$^{-3}$ and $1E17$ cm$^{-3}$, for example.

In the diode shown in FIG. 5 and the MOS transistor shown in FIG. 6, the doping concentration of the drift region 212, 312 equals the doping concentration of the basic doping of the semiconductor body. According to one example, a doping concentration of the field-stop region 11 is between 5 times and 100 times the doping concentration of the basic doping.

According to one example, forming the n-type emitter 213 in the diode shown in FIG. 5 or the drain region 313 in the MOS transistor shown in FIG. 6 includes an implantation process followed by a short time laser annealing process. The annealing process may be such that the annealed semiconductor material melts and re-crystallizes or does not melt.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   implanting particles via a first surface into an end-of-range region of a semiconductor body, the semiconductor body being intrinsic or having only an n-type doping concentration lower than $1E14$ cm$^{-3}$ just prior to the implanting, the end-of-range region being a location in the semiconductor body spaced apart from the first surface where a majority of the implanted particles come to rest in the semiconductor body, the implanted particles kicking out impurity atoms from substitutional sites of the crystal lattice of the semiconductor body so that the impurity atoms come to rest at interstitial sites of the crystal lattice of the semiconductor body;
   after implanting the particles, removing semiconductor material between a second surface of the semiconductor body opposite the first surface and the end-of-range region; and annealing the semiconductor body in a first annealing process at a temperature of between 300° C. and 450° C. to diffuse at least some of the interstitial impurity atoms out of the semiconductor body.

2. The method of claim 1, wherein a duration of the first annealing process is between 30 minutes and 80 hours.

3. The method of claim 2, wherein the temperature in the first annealing process is between 300° C. and 350° C., and wherein the duration of the first annealing process is between 2 hours and 80 hours.

4. The method of claim 1, wherein the temperature in the first annealing process is between 350° C. and 400° C., and wherein a duration of the first annealing process is between 30 minutes and 10 hours.

5. The method of claim 4, wherein the duration of the first annealing process is between 2 hours and 4 hours.

6. The method of claim 1, further comprising:
implanting protons via the second surface into a region of the semiconductor body from which the at least some of the interstitial impurity atoms were diffused out by the first annealing process; and
annealing the semiconductor body in a second annealing process to form hydrogen induced donors based on the protons implanted via the second surface.

7. The method of claim 1, wherein the particles comprise at least one of protons and helium ions.

8. The method of claim 7, wherein the particles comprise protons and wherein the method further comprises:
annealing the semiconductor body in a further annealing process after implanting the particles and before removing the semiconductor material between the second surface and the end-of-range region,
wherein a temperature in the further annealing process is between 460° C. and 550° C. and a duration of the further annealing process is between 2 hours and 10 hours.

9. The method of claim 8, wherein the temperature in the further annealing process is between 460° C. and 520° C.

10. The method of claim 1, wherein the impurity atoms include carbon atoms.

11. The method of claim 1, wherein the impurity atoms includes nitrogen atoms.

12. A method, comprising:
implanting particles via a first surface into a semiconductor body, the implanted particles kicking out impurity atoms from substitutional sites of the crystal lattice of the semiconductor body so that the impurity atoms come to rest at interstitial sites of the crystal lattice of the semiconductor body;
after implanting the particles, reducing a thickness of the semiconductor body by removing semiconductor material of the semiconductor body;
annealing the semiconductor body in a first annealing process at a temperature of between 300° C. and 450° C. to diffuse at least some of the interstitial impurity atoms out of the semiconductor body so as to form a low impurity region which remains in the semiconductor body after the thickness of the semiconductor body is reduced;
implanting protons into the low impurity region of the semiconductor body; and
annealing the semiconductor body in a second annealing process at a temperature of between 360° C. and 420° C. to form a doped region in the low impurity region of the semiconductor body.

13. The method of claim 12, wherein a duration of the first annealing process is between 30 minutes and 80 hours.

14. The method of claim 13, wherein the temperature in the first annealing process is between 300° C. and 350° C., and wherein the duration of the first annealing process is between 2 hours and 80 hours.

15. The method of claim 12, wherein the temperature in the first annealing process is between 350° C. and 400° C., and wherein a duration of the first annealing process is between 30 minutes and 10 hours.

16. The method of claim 15, wherein the duration of the first annealing process is between 2 hours and 4 hours.

17. The method of claim 12, wherein reducing the thickness of the semiconductor body comprises removing semiconductor material of the semiconductor body at a second surface opposite the first surface.

18. The method of claim 17, wherein implanting the particles into the semiconductor body comprises implanting the particles into an end-of-range region spaced apart from the first surface, and wherein reducing the thickness of the semiconductor body comprises removing the end-of-range region.

19. The method of claim 18, wherein the protons are implanted via the second surface, and wherein the second annealing process forms hydrogen induced donors based on the protons implanted via the second surface.

20. The method of claim 12, wherein the particles comprise at least one of protons and helium ions.

21. The method of claim 12, wherein the impurity atoms include carbon atoms.

22. The method of claim 12, wherein the impurity atoms include nitrogen atoms.

\* \* \* \* \*